(12) United States Patent
Lien et al.

(10) Patent No.: US 7,401,756 B2
(45) Date of Patent: Jul. 22, 2008

(54) EXTENDABLE TRAY STRUCTURE

(75) Inventors: Chun-Yi Lien, Panchiao (TW);
Sheng-Fu Hsu, Chungho (TW)

(73) Assignee: Quanta Computer Inc., Tao Yuan Shien (TW)

( * ) Notice: Subject to any disclaimer, the term of this patent is extended or adjusted under 35 U.S.C. 154(b) by 777 days.

(21) Appl. No.: 10/926,015

(22) Filed: Aug. 26, 2004

(65) Prior Publication Data

US 2005/0194287 A1 Sep. 8, 2005

(30) Foreign Application Priority Data

Mar. 5, 2004 (TW) .............................. 93203339 U

(51) Int. Cl.
*A47G 29/00* (2006.01)
*B65D 19/00* (2006.01)
*B65D 6/00* (2006.01)
*B65D 6/04* (2006.01)
*B65D 6/06* (2006.01)

(52) U.S. Cl. ............................. 248/346.07; 248/346.06; 220/559; 220/8; 361/727; 221/175; 221/126.15; 221/126.4; 221/126.7; 312/223.2

(58) Field of Classification Search .................... 220/8, 220/558, 559; 206/565; 211/175, 189, 190, 211/191, 26, 90.04, 126.1–133.6, 72; 248/917, 248/346.01–346.07; 312/208.1, 223.1, 223.2, 312/319.1, 333, 348.2; 361/679–685, 724, 361/725, 727, 730; 439/157, 64, 924, 928, 439/928.1

See application file for complete search history.

(56) References Cited

U.S. PATENT DOCUMENTS

| | | | | | |
|---|---|---|---|---|---|
| 5,340,340 | A | * | 8/1994 | Hastings et al. | 439/64 |
| 6,059,386 | A | * | 5/2000 | Yu | 312/223.2 |
| 6,227,630 | B1 | * | 5/2001 | Brown et al. | 312/223.2 |
| 6,442,030 | B1 | * | 8/2002 | Mammoser et al. | 361/727 |
| 6,481,809 | B1 | * | 11/2002 | Richardson | 312/223.2 |
| 6,488,256 | B1 | * | 12/2002 | Chang | 248/670 |
| 7,035,099 | B2 | * | 4/2006 | Wu | 361/685 |
| 7,124,896 | B2 | * | 10/2006 | Cellini et al. | 211/26 |
| 2002/0084734 | A1 | * | 7/2002 | Shih | 312/334.4 |
| 2003/0019822 | A1 | * | 1/2003 | Liu | 211/26 |
| 2004/0026590 | A1 | * | 2/2004 | Lin | 248/346.04 |
| 2005/0162050 | A1 | * | 7/2005 | Berger et al. | 312/108 |
| 2006/0032827 | A1 | * | 2/2006 | Phoy | 211/59.2 |

* cited by examiner

*Primary Examiner*—Anthony D Stashick
*Assistant Examiner*—Ned A Walker
(74) *Attorney, Agent, or Firm*—Rabin & Berdo, PC

(57) ABSTRACT

An extendable tray structure is disclosed for receiving a server. The extendable tray structure is composed of a tray main body, a tray extension body and a plurality of locking elements, wherein the tray main body has a plurality of locking holes, and the tray extension body has a plurality of stripe-shaped openings which are parallel to each other, and the locking elements are installed on the locking holes of the tray main body through the stripe-shaped openings. The extendable tray structure is featured in extending and adjusting the length of the tray structure by positioning the locking elements in the stripe-shaped openings.

10 Claims, 4 Drawing Sheets

EXTENDABLE TRAY STRUCTURE

FIELD OF THE INVENTION

The present invention relates to an extendable tray structure, and more particularly, to the extendable tray structure that can receive servers of various sizes.

BACKGROUND OF THE INVENTION

A server is usually held in a tray structure, and sliding rails are mounted on both sides of the tray structure for protecting the server and benefiting the server to move. With the daily increase of various applications, the size of the server is frequently changed in accordance with different requirements, and thus the server is much heavier than ever. When the size of the receiver is changed (such as from 20 inches to 24 inches), the old tray can be used no longer, and another tray has to be used instead to hold the new sever. When the server has been used for a certain period of time, the siding rails located on both sides of the tray will be deformed, and particularly for holding an even heavier server (such as in 5U specification), the conventional tray is not sustainable, and has to be replaced frequently, thus not only causing a lot of inconvenience to users, but also wasting quite a lot of money.

Since the conventional server tray structure has the difficulty of sustaining a heavy server, and cannot satisfy the needs of changing the server's size, the server tray has to be replaced quite often.

Hence, there is a need to develop an extendable tray structure for effectively adjusting the length of the tray structure for receiving servers with various sizes; reinforcing the strength of the tray structure, so as to sustain heavier servers.

SUMMARY OF THE INVENTION

It is an object of the present invention to provide an extendable tray structure for effectively positioning the length of the tray structure, whereby servers of various sizes can be held with one single tray structure and no tray has to be replaced.

It is the other object of the present invention to provide an extendable tray structure for reinforcing the strength of the tray structure so as to sustain a heavier server.

According to the aforementioned objects of the present invention, the present invention provides an extendable tray structure for receiving a server.

According to a preferred embodiment of the present invention, the extendable tray structure is composed of a tray main body, a tray extension body and a plurality of locking elements.

Further, the tray main body has a first open end, and is composed of a main bottom plate and a pair of main side plates. The main bottom plate has a first locking hole, a second locking hole and a third locking hole, wherein the first locking hole and the third locking hole are adjacent to the first open end, and the second locking hole is located between the first locking hole and the third locking hole and at a position near the center of the main bottom plate. The main side plates are located on two opposites sides of the main bottom plate, wherein each of the main side plates has a fourth locking hole adjacent to the open end.

Further, the tray extension body has a second open end, wherein the second open end is located at the same side with the first open end, and the tray extension body is connected to the tray main body and is overlapped with a portion of the tray main body. The tray extension body is composed of an extension bottom plate and a pair of first extension side plates. The extension bottom plate has a first stripe-shaped opening, a second stripe-shaped opening and a third stripe-shaped opening which are parallel to one another and are corresponding to the first locking hole, the second locking and the third locking hole respectively. The first extension side plates are located on two opposite sides of the extension bottom plate, wherein each of the first extension side plates has a fourth stripe-shaped opening corresponding to the fourth locking hole, and the first stripe-shaped opening, the second stripe-shaped opening, the third stripe-shaped opening and the fourth stripe-shaped opening all extend from one end near the second open end to the other end away from the second open end.

Further, the locking elements include a first locking element, a second locking element and a third locking element that are installed in the first locking hole, the second locking hole and the third locking hole via the first stripe-shaped opening, the second stripe-shaped opening and the third stripe-shaped opening, thereby combining the extension bottom plate with the main bottom plate.

Further, the locking elements include a pair of fourth locking elements, wherein each of the fourth locking elements is installed in the fourth locking hole via the fourth stripe-shaped opening, thereby combining the first extension body side plates with the main side plate, so that the length of the extendable tray structure is adjustable for receiving servers of various sizes by adjusting the positions of the locking elements located in the stripe-shaped openings.

Hence, with the application of the present invention, the length of the tray structure can be effectively adjusted for receiving servers of various sizes; and the strength of the tray structure can be greatly reinforced for sustaining heavier servers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

An extendable tray structure of the present invention is featured in extending and adjusting the length of the tray structure by adjusting the positions of the locking elements located in the stripe-shaped openings of the tray extension body.

Figure 1:
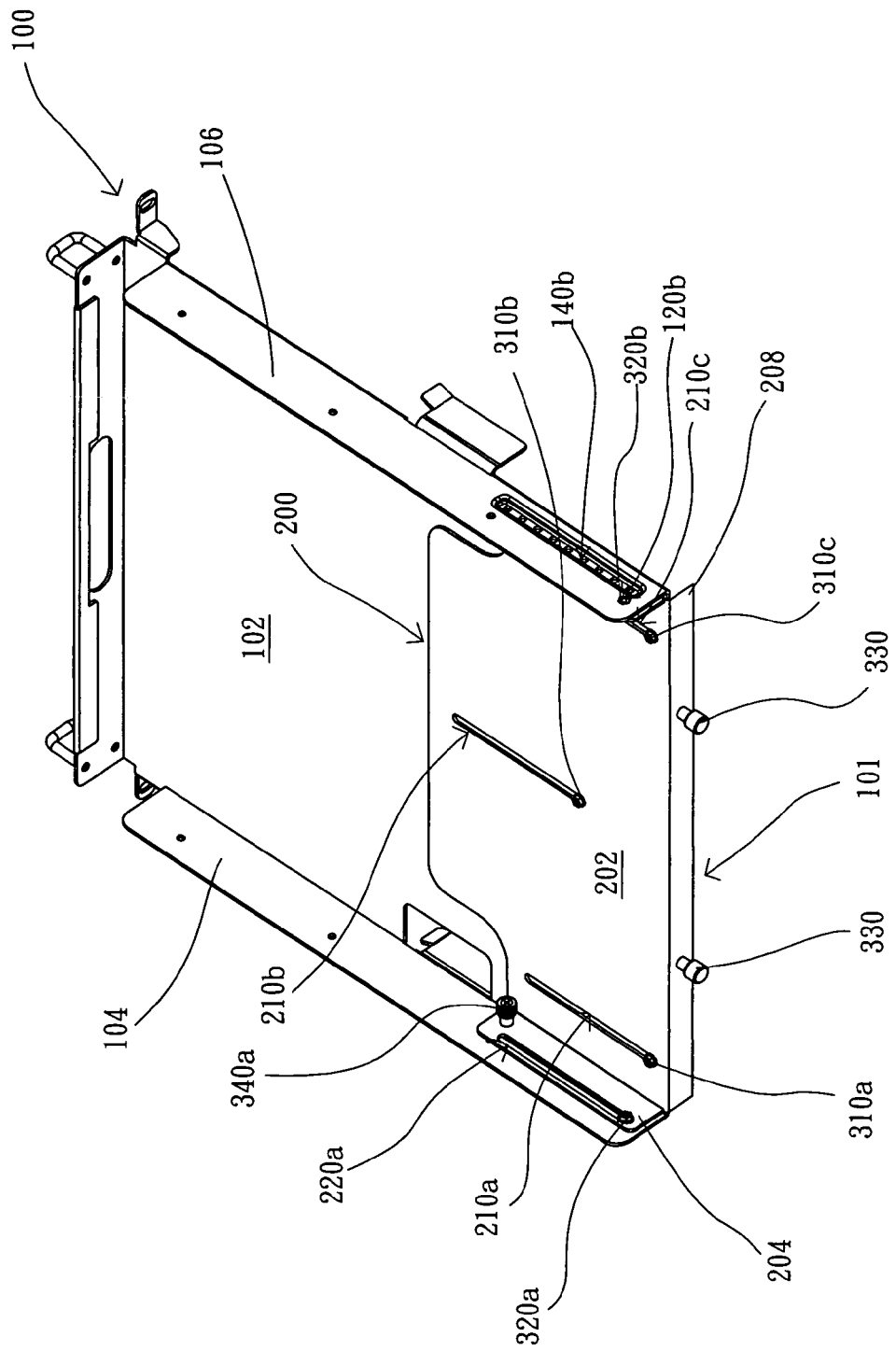
FIG. 1 is a 3-D schematic view showing an extendable tray structure according to a preferred embodiment of the present invention, wherein the tray structure is under the condition of minimum length.

Referring to FIG. 1, FIG. 1 is a 3-D schematic view showing an extendable tray structure according to a preferred embodiment of the present invention, wherein the tray structure is under the condition of minimum length. The extendable tray structure of the present invention is composed of a tray main body 100, a tray extension body 200, locking elements 310a, 310b, and 310c, and locking elements 320a and 320b (such as screws), wherein the tray extension body 200 is located in the tray main body 100.

Figure 2:
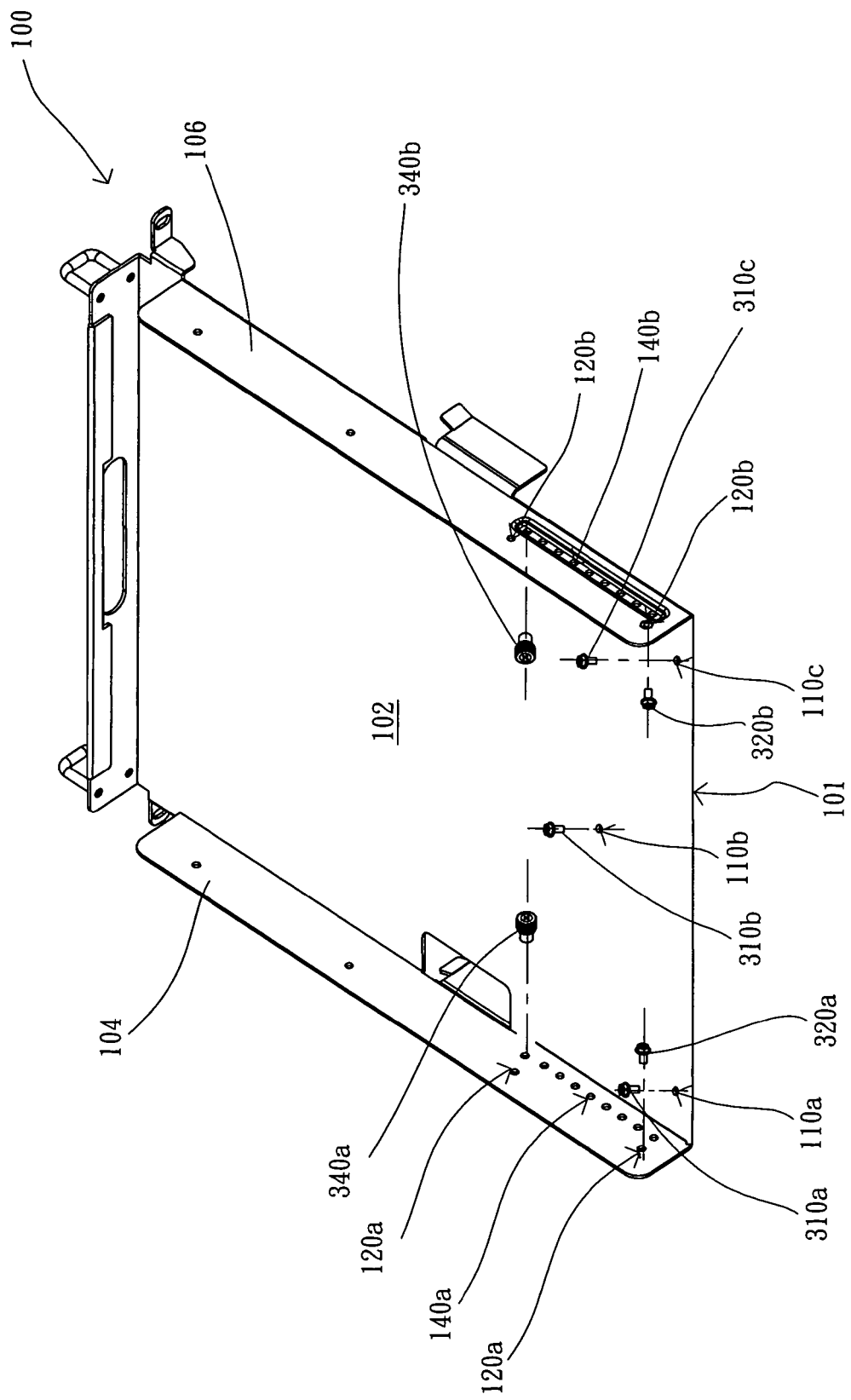
FIG. 2 a 3-D schematic view showing a tray main body according to the preferred embodiment of the present invention.

Referring to FIG. 1 and FIG. 2, FIG. 2 is a 3-D schematic view showing a tray main body according to the preferred embodiment of the present invention. The tray main body 100 has an open end 101, and is composed of a main bottom plate 102 and a pair of main side plates 104 and 106. The main bottom plate 102 has locking holes 110a, 110b and 110c, wherein the locking hole 110a and the locking hole 110c are adjacent to the aforementioned open end. The locking hole 110b is located between the locking hole 110a and the locking hole 110c (such as at the central position therebetween), and the locking hole 110b is closer to the center of the main bottom plate 102 than the locking hole 110a and 110c. Such as shown in FIG. 2, the locking hole 110a, the locking hole 110b and the locking hole 110c are located on the corners of an isosceles triangle. Further, the main side plates 104 and 106 are located on two opposites sides of the main bottom plate 102, wherein the main side plates 104 and 106 have locking holes 120a and 120b adjacent to the aforementioned open end, and a plurality of fixing holes 140a and 140b located under the locking holes 120a and 120b, wherein the locking holes 120a and 120b are used for fastening locking elements 320a and 320b.

Figure 3A:
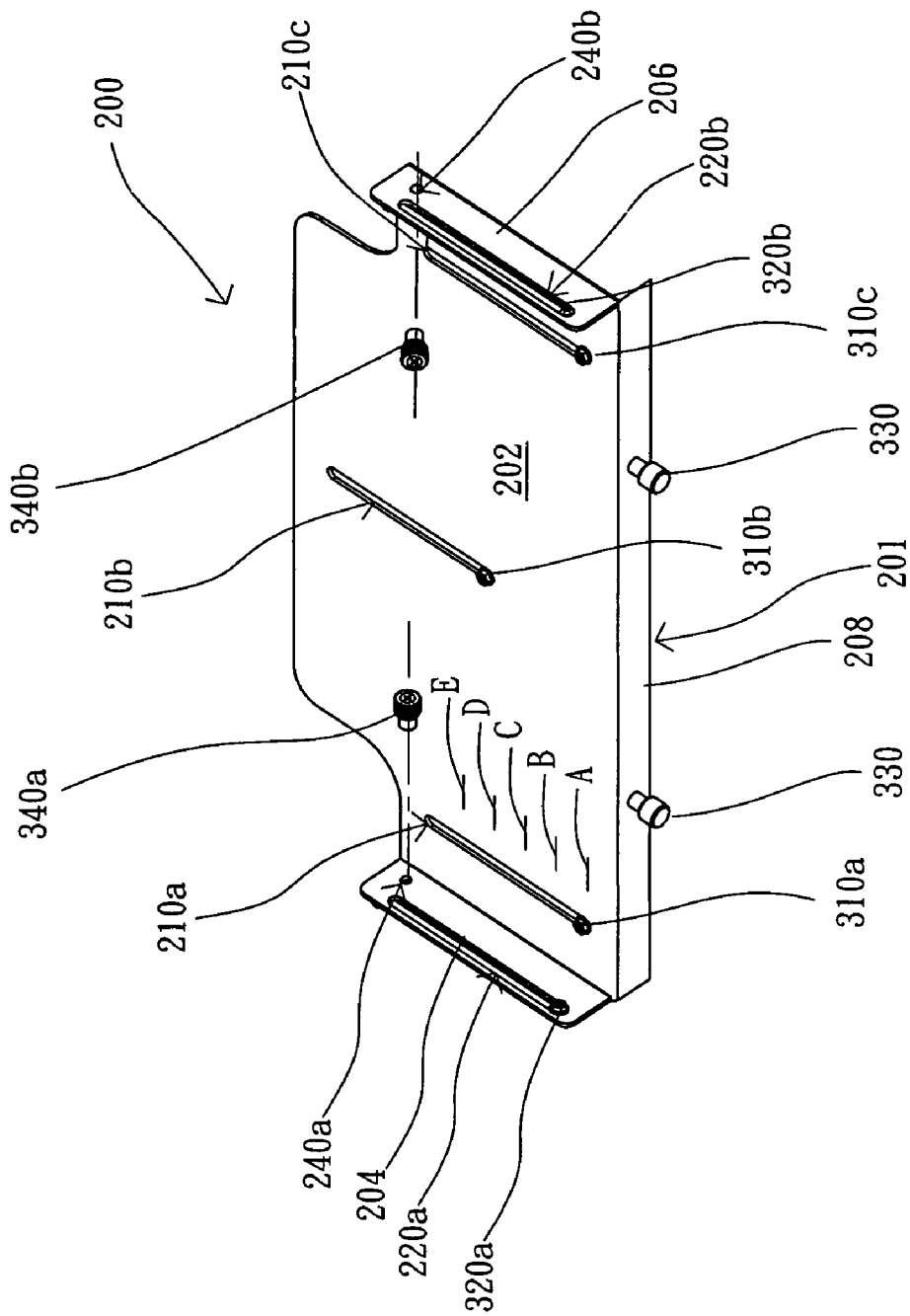
FIG. 3A a 3-D schematic view showing a tray extension body according to the preferred embodiment of the present invention.
Figure 3B:
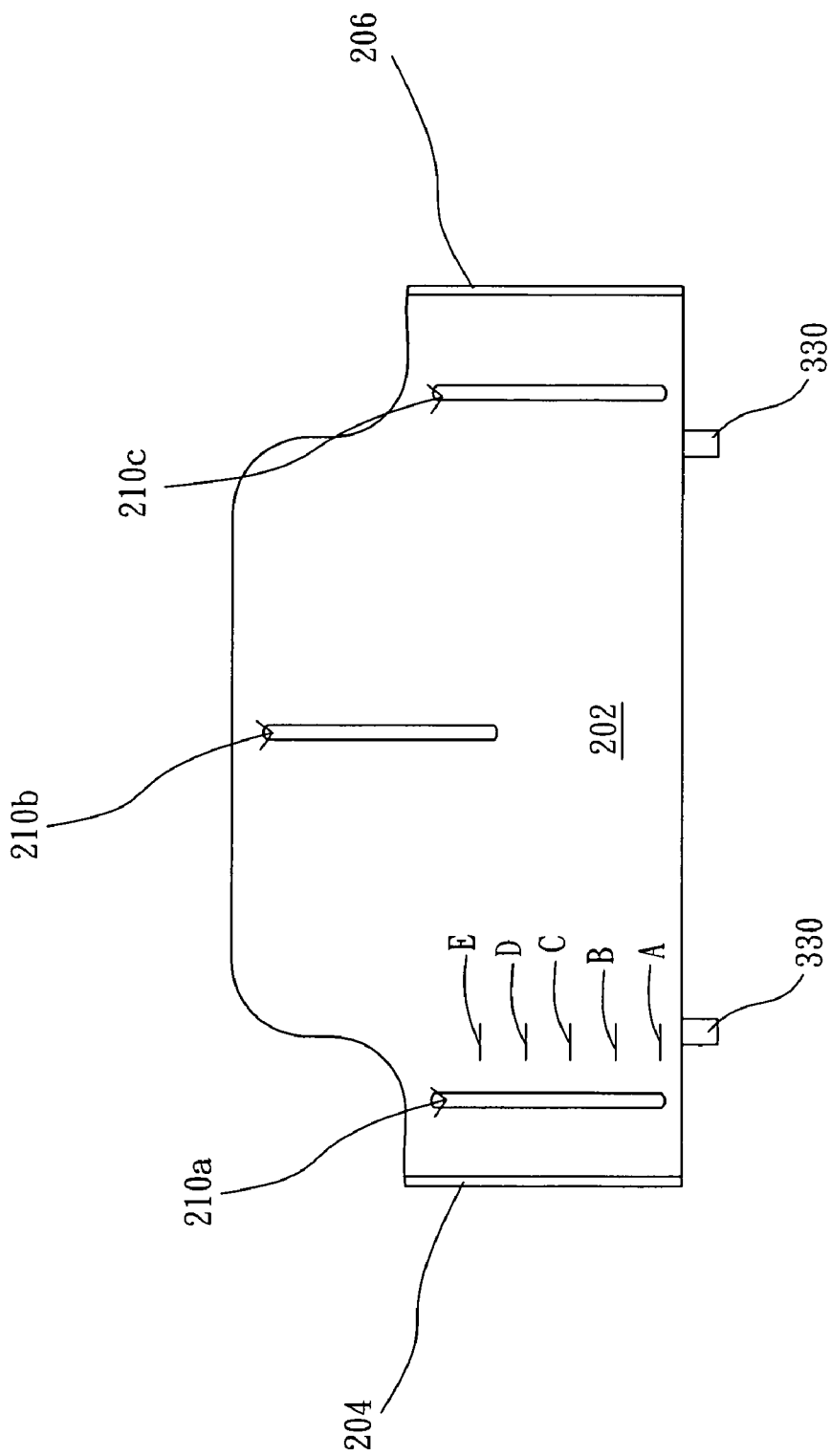
FIG. 3B a schematic diagram showing the top view of a tray extension body according to the preferred embodiment of the present invention.

Referring to FIG. 1, FIG. 3A and FIG. 3B, FIG. 3A and FIG. 3B are schematic diagrams respectively showing a 3-D view and a top view of the tray extension body according to the preferred embodiment of the present invention. The tray extension body 200 has a second open end 201, wherein the open end is located at the same side with the aforementioned open end 101 of the tray main body 100. The tray extension body 200 is connected to the tray main body 100, and is overlapped with a portion of the main bottom plate 102 (or almost the entire main bottom plate 102 such as shown in FIG. 1). The tray extension body 200 is composed of an extension bottom plate 202 and a pair of extension side plates 204 and 206. The extension bottom plate 202 has stripe-shaped openings 210a, 210b and 201c which are parallel to one another and are corresponding to the locking holes 110a, 110b and 110c as shown in FIG. 2 respectively. The extension side plates 204 and 206 are located on two opposite sides of the extension bottom plate 202, wherein the extension side plates 204 and 206 have respective stripe-shaped opening 220a and 220b, and the locking holes 120a and 120b as shown in FIG. 2 are corresponding to the stripe-shaped opening 220a and 220b. The first stripe-shaped opening 210a, the second stripe-shaped opening 210b, the third stripe-shaped opening 210c, and the stripe-shaped openings 220a and 220b all extend from one end near the second open end 201 of the tray extension body 200 to the other end away from the second open end 201 thereof. Thus, the locking elements 310a, 310b and 310c can be installed in the locking holes 110a, 110b and 110c via the stripe-shaped openings 210a, 210b and 210c, thereby combining the extension bottom plate 202 together with the main bottom plate 102. Also, the locking elements 320a and 320b can be installed in the locking holes 120a and 120b via the stripe-shaped openings 220a and 220b, thereby combining the extension side plates 204 and 206 together with the main side plates 104 and 106 respectively.

It is noted that, when the locking elements 310a, 310b and 310c and the locking elements 320a and 320b are fixed in one end of the stripe-shaped openings 210a, 210b and 210c and the stripe shaped openings 220a and 220b which are adjacent to the open end 101 of the tray main body 100, the extendable tray structure (the combination of the tray main body 100 and the tray extension body 200) has a minimum length, so that a smaller server can be received therein. Similarly, when the locking elements 310a, 310b and 310c and the locking elements 320a and 320b are fixed in the other end of the stripe-shaped openings 210a, 210b and 210c and the stripe-shaped openings 220a and 220b which are adjacent to the center of the tray main body 100, the extendable tray structure (the combination of the tray main body 100 and the tray extension body 200) has a maximum length, so that a bigger server can be received therein. Therefore, the present invention is featured in extending and adjusting the length of the tray structure by adjusting the positions of the locking elements located in the stripe-shaped openings of the tray extension body, so as to receive different servers of various sizes.

Further, such as shown in FIG. 3A and FIG. 3B, in order to conveniently position the locking elements in the stripe-shaped openings for enabling a tray structure to receive different servers of various sizes, a plurality of markings A, B, C, D and E can be engraved on the extension bottom plate 202 (such at the location beside the longer side of the stripe-shaped opening 310a), wherein, for example, marking E stands for the tray structure in which a 24-inch server can be received; marking A stands for the tray structure in which a 20-inch server can be received; and marking s B, C and D stand for various trays which can accommodate 21-inch, 22-inch and 23-inch servers respectively. While the positions of the locking elements in the stripe-shaped openings are adjusted, the tray structure can be rapidly adjusted to a proper length by merely aligning the locking elements to one of the markings A, B, C, D and E.

Further, such as shown in FIG. 1 and FIG. 3A, the tray extension body 200 can have an extension side plate 208, and the extension side plate 208 are located at the same side with the second open end 201. The extension side plate 208 can be located either above or below the extension bottom plate 202 of the tray extension body 200, and the extension direction thereof can be opposite to that of the extension side plates 204 and 206. At least one withdrawing element 330 can be installed on the surface of the extension side plate 208 facing outwards for conveniently moving the tray extension body 200.

Further, such as shown in FIG. 2 and FIG. 3A, the extension side plates 204 and 206 have respective fixing holes 240a and 240b, and the main side plates 104 and 106 have a plurality of fixing holes 140a and 140b respectively. A fixing element 340a (such as a screw) is installed in one of the fixing holes 140a via the fixing hole 240a, and a fixing element 340b (such as a screw) is installed in one of the fixing holes 140b via the fixing hole 240b, wherein the fixing elements 340a and 340b are used for fixing the tray extension body 200 (the extension side plates 204 and 206) to the tray main body 100 (the main side plates 104 and 106) more firmly, thereby reinforcing the strength of the tray structure for sustaining heavier servers.

It is worthy to be noted that the positions and shapes regarding the aforementioned components, locking hole, fixing holes and stripe-shaped openings are merely stated as an example for explanation, and the present invention is not limited thereto.

It can be known from the aforementioned preferred embodiment of the present invention, the present invention has an advantage of effectively and briefly adjusting the length of the tray structure; greatly reinforcing the strength of the tray structure, thereby receiving different servers of various sizes and larger weight with one single tray structure, thus saving a lot of expenditure for purchasing various server trays. Therefore, the present invention has considerably high industrial application value.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An extendable tray structure, used for receiving a server, said extendable tray structure comprising:
   a tray main body, having a first open end, wherein said tray main body comprises:
      a main bottom plate, having a first locking through part, a second locking through part and a third locking through part which are located near said first open end of said tray main body, wherein said second locking through part is located between said first locking through part and said third locking through part and at a position near the center of said main bottom plate; and
      a pair of main side plates, located on two opposites sides of said main bottom plate, wherein each of said main side plates has a fourth locking through part adjacent to said first open end;
   a tray extension body, having a second open end, wherein said second open end is located at the same side with said first open end, and said tray extension body is connected to said tray main body and is overlapped with a portion of said tray main body, said tray extension body comprising:
      an extension bottom plate, having a first stripe-shaped opening, a second stripe-shaped opening and a third stripe-shaped opening which are parallel to one another and are corresponding to said first locking through part, said second locking through part and said third locking through part respectively; and
      a pair of first extension side plates, located on two opposite sides of said extension bottom plate, wherein each of said first extension side plates has a fourth stripe-shaped opening corresponding to said fourth locking through part, and said first stripe-shaped opening, said second stripe-shaped opening, and said fourth stripe-shaped opening all extend from one end near said second open end to the other end away from said second open end, said third stripe-shaped opening extending from near the other end spaced away from said second open end, to near a center of said extension bottom plate;
   a first locking element, a second locking element and a third locking element, installed in said first locking through part, said second locking through part and said third locking through part via said first stripe-shaped opening, said second stripe-shaped opening and said third stripe-shaped opening, respectively, thereby combining said extension bottom plate with said main bottom plate; and
   a pair of fourth locking elements, wherein each of said fourth locking elements is installed in said fourth locking through part of said tray main body via said fourth stripe-shaped opening, thereby combining said first extension body side plates with said main side plate, so that the length of said extendable tray structure is adjustable for receiving servers of various sizes by adjusting the position of said first locking element in said first stripe-shaped opening, that of said second locking element in said second stripe-shaped opening, that of said third locking element in said third stripe-shaped opening, and that of each of said fourth locking elements in said fourth stripe-shaped opening.

2. The extendable tray structure of claim 1, wherein said first locking through part and said second locking through part are located at the same distance from said first open end.

3. The extendable tray structure of claim 1, wherein said tray extension body has an second extension side plate, and said second extension side plate is located at the same side with said second open end.

4. The extendable tray structure of claim 3, further comprising: at least one withdrawing element, installed on an outer surface of said second extension side plate for moving said tray extension body.

5. The extendable tray structure of claim 3, wherein said second extension side plate is located under said tray extension body.

6. The extendable tray structure of claim 1, further comprising a pair of fixing elements, used for fixing said first extension side plates to said main side plates.

7. The extendable tray structure of claim 6, wherein each of said first extension plates has a first fixing through part, and each of said main side plates has a plurality of second fixing through parts, and said first fixing through part is corresponding to one of said second fixing through parts for use with each of said fixing elements.

8. The extendable tray structure of claim 6, wherein said fixing elements, said first locking element, said second locking element and said third locking element are screws.

9. The extendable tray structure of claim 1, wherein said first locking through part, said second locking through part and said third locking through part are located on the corners of an isosceles triangle.

10. The extendable tray structure of claim 1, wherein said extension bottom plate has a plurality of markings respectively corresponding to a plurality of positions of said first locking element located in said first stripe-shaped opening.

* * * * *